| (12) | United States Patent | (10) Patent No.: US 11,943,902 B2 |
|---|---|---|
| | Isaji et al. | (45) Date of Patent: Mar. 26, 2024 |

(54) CIRCUIT STRUCTURE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yusuke Isaji, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 201 days.

(21) Appl. No.: 17/771,660

(22) PCT Filed: Oct. 29, 2020

(86) PCT No.: PCT/JP2020/040667
§ 371 (c)(1),
(2) Date: Apr. 25, 2022

(87) PCT Pub. No.: WO2021/090761
PCT Pub. Date: May 14, 2021

(65) Prior Publication Data
US 2022/0386456 A1 Dec. 1, 2022

(30) Foreign Application Priority Data
Nov. 6, 2019 (JP) .................................. 2019-201590

(51) Int. Cl.
*H05K 7/20* (2006.01)

(52) U.S. Cl.
CPC ..... *H05K 7/20872* (2013.01); *H05K 7/20927* (2013.01)

(58) Field of Classification Search
CPC .......... H05K 7/20872; H05K 7/20927; H05K 7/20218; H05K 7/20254
See application file for complete search history.

(56) References Cited

U.S. PATENT DOCUMENTS

| 9,559,508 B2 * | 1/2017 | Shepard ............. H05K 7/20845 |
| 10,637,224 B2 * | 4/2020 | Hiramitsu ................ H05K 7/20 |

(Continued)

FOREIGN PATENT DOCUMENTS

| JP | 2014-079093 | 5/2014 |
| JP | 2018-038128 | 3/2018 |
| WO | 2013/069277 | 5/2013 |

OTHER PUBLICATIONS

Official Communication issued in International Bureau of WIPO Patent Application No. PCT/JP2020/040667, dated Dec. 22, 2020, along with an English translation thereof.

*Primary Examiner* — Zachary Pape
(74) *Attorney, Agent, or Firm* — GREENBLUM & BERNSTEIN, P.L.C.

(57) ABSTRACT

Provided is a circuit structure having a novel structure with which the dissipation of heat from a heat generating component can be more reliably promoted with a short heat transfer path. A circuit structure includes: a heat generating component; bus bars connected to connection portions of the heat generating component; an insulating base member configured to hold the heat generating component and the bus bars; and a coolant flow path provided inside the base member and through which a coolant flows, the bus bars being in thermal contact with the coolant flow path.

5 Claims, 5 Drawing Sheets

(56) References Cited

U.S. PATENT DOCUMENTS

| | | |
|---|---|---|
| 2014/0319673 A1 | 10/2014 | Zhou et al. |
| 2015/0101838 A1 | 4/2015 | Shepard et al. |
| 2017/0062307 A1 | 3/2017 | Pola |
| 2019/0214805 A1 | 7/2019 | Hiramitsu et al. |
| 2020/0194159 A1* | 6/2020 | Tsuchida ............. H01F 27/2852 |
| 2021/0376750 A1* | 12/2021 | Kumakura ......... H05K 7/14329 |
| 2022/0158287 A1* | 5/2022 | Hwang ............. B29C 45/14631 |

* cited by examiner

CIRCUIT STRUCTURE

TECHNICAL FIELD

The present disclosure relates to a circuit structure that includes a heat-generating component.

BACKGROUND ART

Conventionally, a circuit structure including a heat generating component such as a relay is installed in a vehicle. For example, Patent Document 1 discloses a circuit structure that is provided with a relay that interrupts the supply of power from a battery to a motor or a generator that is connected via an inverter, the battery and the motor serving as vehicle-side loads.

Because large currents flow through a heat generating component such as a relay used in such a circuit structure, Joule heat that is proportional to the square of the current amount is generated, and the amount of emitted heat also increases. Thus a structure in which heat from a relay is dissipated using an intermediate portion of a bus bar that connects a connection portion of the relay housed in a case and a connection terminal of a battery that is arranged outside the case is proposed in Patent Document 1. Specifically, a structure is disclosed in which the intermediate portion of the bus bar, which is extended to the outside of the case housing the relay, is brought into contact with a chassis, a housing that houses an entire power supply device, or the like via a heat transfer sheet, whereby heat generated by the relay is transferred to the chassis or the housing and dissipated.

CITATION LIST

Patent Documents

Patent Document 1: JP 2014-79093A

SUMMARY OF INVENTION

Technical Problem

Incidentally, in order for a bus bar that constitutes a conductive member that connects the relay and the battery to able to withstand large currents, a large thickness and area need to be secured. Therefore, in the structure disclosed in Patent Document 1, a heat dissipation path needs to be added using a large bus bar, which gives rise to the issue of an increase in material and machining costs. Also, the large bus bar needs to be extended out over a long distance to another member provided outside the case in order to dissipate heat, and an increase in the distance between a connection portion of the relay and a heat dissipation portion cannot be avoided. Thus, there is the inherent issue of not being able to efficiently dissipate heat generated by the relay.

Therefore, a novel circuit structure that can more reliably promote the dissipation of heat from a heat generating component with a short heat transfer path is disclosed.

Solution to Problem

A circuit structure according to the present disclosure is a circuit structure including: a heat generating component; a bus bar connected to a connection portion of the heat generating component; an insulating base member configured to hold the heat generating component and the bus bar; and a coolant flow path provided inside the base member and through which a coolant flows, wherein the bus bar is in thermal contact with the coolant flow path, the base member includes a passage wall portion constituting the coolant flow path, and the bus bar is brought into thermal contact with the coolant flow path due to a portion of the bus bar being embedded or press-fitted into the passage wall portion, and the passage wall portion includes a groove through which the coolant flows and a protruding portion that protrudes into the groove, the protruding portion includes a slit-shaped bus bar housing groove that is open in the upper surface thereof that does not face the groove, and the bus bar is press-fitted into the bus bar housing groove.

Advantageous Effects of Invention

According to the present disclosure, the dissipation of heat from a heat generating component can be more reliably promoted with a short heat transfer path.

DESCRIPTION OF EMBODIMENTS

Description of Embodiments of Present Disclosure

Figure 1:
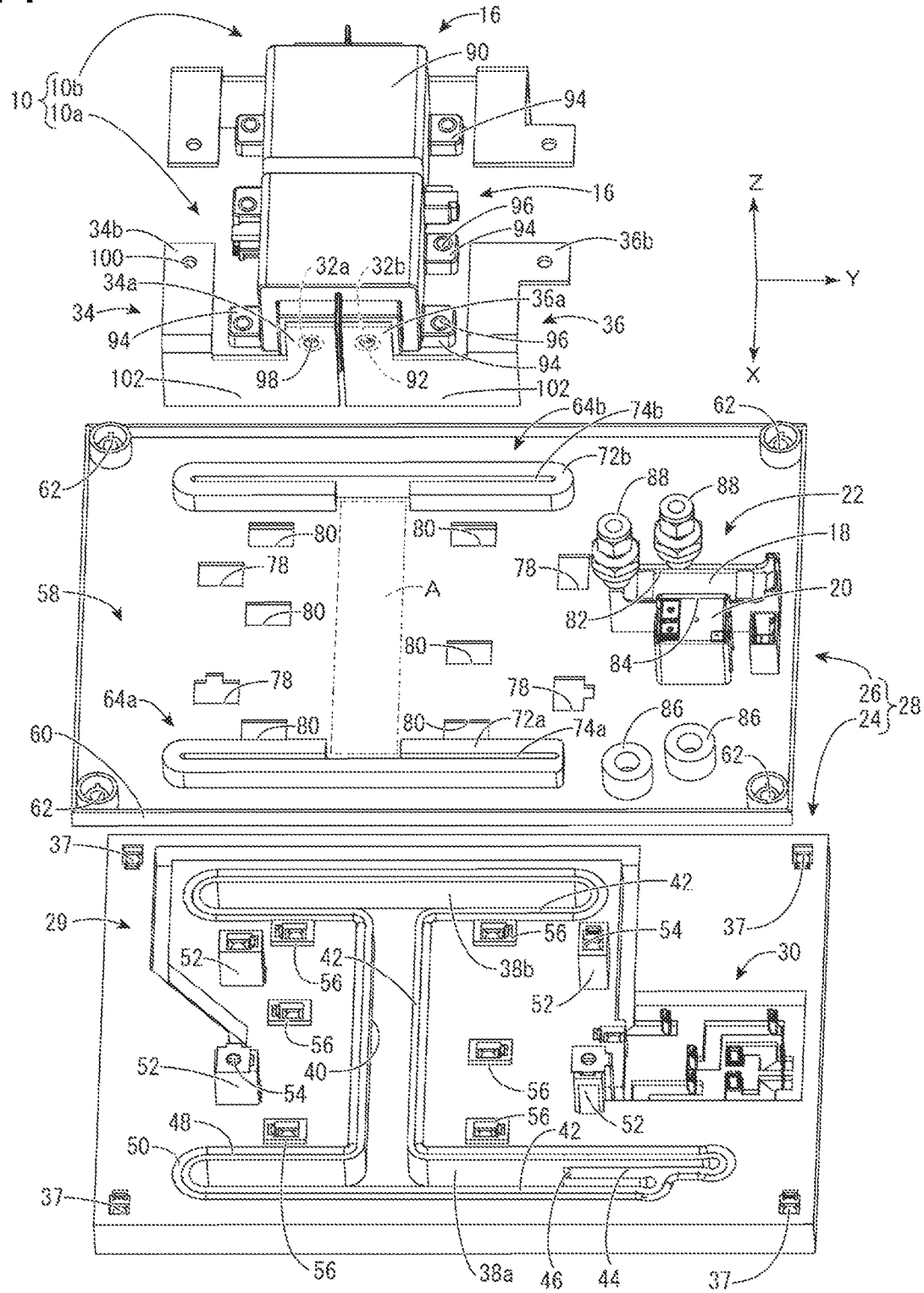
FIG. 1 is an exploded perspective view showing a circuit structure according to Embodiment 1 of the present disclosure.

First, aspects of the present disclosure will be listed and described.

A circuit structure according to the present disclosure is (1) a circuit structure including: a heat generating component; a bus bar connected to a connection portion of the heat generating component; an insulating base member configured to hold the heat generating component and the bus bar; and a coolant flow path provided inside the base member and through which a coolant flows, wherein the bus bar is in thermal contact with the coolant flow path, the base member includes a passage wall portion constituting the coolant flow path, and the bus bar is brought into thermal contact with the coolant flow path due to a portion of the bus bar being embedded or press-fitted into the passage wall portion, and the passage wall portion includes a groove through which the coolant flows and a protruding portion that protrudes into the groove, the protruding portion includes a slit-shaped bus bar housing groove that is open in the upper surface thereof that does not face the groove, and the bus bar is press-fitted into the bus bar housing groove.

With the circuit structure according to the present disclosure, the coolant flow path is provided in the base member that holds the heat generating component and the bus bar that is connected to the connection portion of the heat generating component, and the bus bar is brought into thermal contact with the coolant flow path. The bus bar to which heat from the heat generating component is transmitted can be brought into thermal contact with the coolant flow path and cooled, and, compared to a conventional structure, the dissipation of heat from the heat generating component can be more reliably promoted with a short heat transfer path, and the heat dissipation capacity of the circuit structure can be improved.

In particular, the bus bar to which heat from the heat generating component is transferred is cooled by the coolant flowing through the coolant flow path, and thus a heat dissipation effect and a cooling effect can be improved in comparison with a conventional structure when the temperature of a chassis or a housing itself that is in thermal contact with the bus bar reaches high temperatures exceeding 70° C.

Note that any coolant can be used as the coolant that flows through the coolant flow path provided that it is a coolant that can be used in a vehicle such as radiator fluid. Also, the thermal contact between the bus bar and the coolant flow path can be realized with a suitable structure in which, for example, the bus bar is arranged in the surrounding region of the coolant flow path, and the bus bar is brought into contact with the passage wall portion that constitutes the coolant flow path. Also, the bus bar is connected to the connection portion of the heat generating component, and thus heat from the heat generating component can be advantageously transmitted, but the bus bar connected to the connection portion of the heat generating component encompasses both a bus bar that is used as a conductive member and a bus bar that is used simply for heat dissipation. Also, by press-fitting a portion of the bus bar into the passage wall portion that constitutes the coolant flow path, the bus bar can be more reliably and stably brought into thermal contact with the coolant flow path, and the heat dissipation capabilities of the circuit structure of the present disclosure can be further advantageously improved (3) In (1), it is preferable that the base member includes a lower case including a lower passage wall portion and an upper case including an upper passage wall portion that is linked in a liquid-tight manner to the lower passage wall portion, and the coolant flow path is formed by including the lower passage wall portion and the upper passage wall portion linked to each other in a liquid-tight manner. This is because a simple structure in which the lower passage wall portion provided on the lower case constituting the base member and the upper passage wall portion provided on the upper case are linked in a liquid-tight matter can be used to form the coolant flow path in the base member in a space-efficient manner.

(4) In (3), it is preferable that the upper passage wall portion includes a lid portion configured to cover the lower passage wall portion. The protruding portion of the upper passage wall portion protrudes into the groove that is demarcated by the lower passage wall portion and through which the coolant flows, and thus the protruding portion can be cooled quickly by the coolant that flows therearound. A portion of the bus bar is embedded or press-fitted into the protruding portion, and thus the bus bar can be quickly cooled using the coolant, and the dissipation of heat from the bus bar of the heat generating component can be further advantageously promoted.

(5) In (3) or (4), it is preferable that at least one of the lower passage wall portion and the upper passage wall portion is configured to include a sealing rubber housing groove for housing a piece of sealing rubber, and due to the sealing rubber being compressed and brought into close contact with the sealing rubber housing groove, the lower passage wall portion and the upper passage wall portion are linked in a liquid-tight manner. The liquid-tight linking between the lower passage wall portion and the upper passage wall portion is reliably ensured by the sealing resin housed in the sealing rubber housing recess provided on at least one of the lower passage wall portion and the upper passage wall portion. Furthermore, by housing the sealing rubber in the sealing rubber housing groove, the holding properties and the positioning properties of the sealing rubber are ensured, and the attachment operation is made easier.

(6) In (1), (2), (3), (4) or (5), it is preferable that a coolant input/output portion is provided protruding from the base member, one end portion of the coolant input/output portion being connected to the coolant flow path, and the other end portion being connected to an external coolant supply path. Coolant that can be used in a vehicle such as radiator fluid can be easily supplied to the coolant flow path via the coolant input/output portion.

Details of Embodiments of Present Disclosure

Specific examples of the circuit structure according to the present disclosure will be described with reference to the drawings below. Note that the present disclosure is not limited to these examples, and is intended to include all modifications that are indicated by the claims and are within the meaning and scope of equivalents of the claims.

Embodiment 1

Embodiment 1 of the present description will be described with reference to FIGS. 1 to 7. A circuit structure 10 is installed in a vehicle (not shown) such as an electric automobile or a hybrid automobile, for example, and supplies electric power from a power source 12 such as a battery to a load 14 such as a motor, and performs control (see FIG. 3). While the circuit structure 10 can be oriented in any direction, in the following description, the Z direction is regarded as the upward direction, the Y direction is regarded as the rightward direction in the length direction, and the X direction is regarded as the forward direction in the width direction. Furthermore, when more than one of the same member is provided, the reference numeral therefor may be provided to only some of the members and may be omitted for the rest.

Schematic Circuit Configuration of Circuit Structure 10

Figure 3:
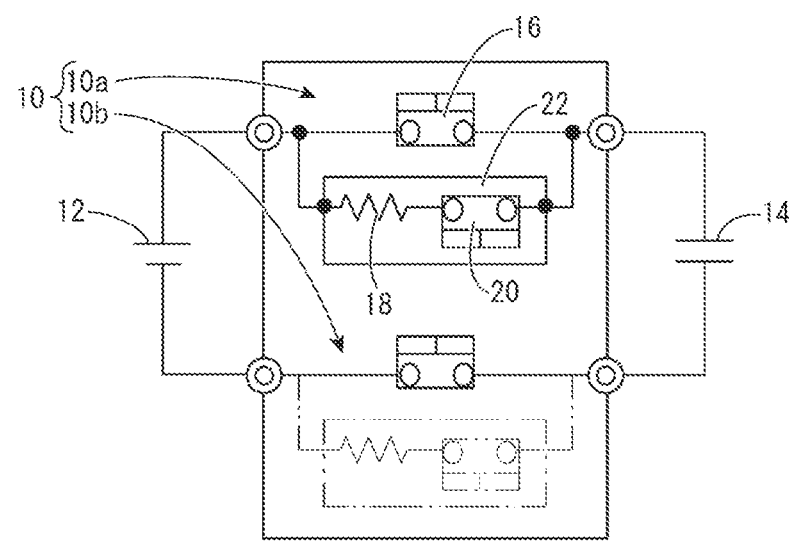
FIG. 3 is a diagram schematically showing an electric configuration of a path between a power supply and a load.

As shown in FIG. 3, the circuit structure 10 includes a circuit structure 10a provided on a positive electrode side and a circuit structure 10b provided on a negative electrode side. The positive electrode of the power supply 12 is connected to the input side of the circuit structure 10a, and the negative electrode of the power supply 12 is connected to the input side of the circuit structure 10b. The positive electrode of the load 14 is connected to the output side of the circuit structure 10a, and the negative electrode of the load 14 is connected to the output side of the circuit structure 10b. Relays 16 that are heat generating components connected to the power supply 12 and the load 14 are respectively connected between the input side and the output side of the circuit structure 10a and the circuit structure 10b. In addition, a pre-charge circuit 22 is connected in series to the relay 16 connecting the positive electrodes of the power supply 12 and the load 14 so that a pre-charge resistor 18 and a pre-charge relay 20 bypass the relay 16. Note that, in Embodiment 1 of the present disclosure, the pre-charge resistor 18 is connected to the input side of the pre-charge relay 20, as shown in FIG. 3. It should be noted that, although a pre-charge circuit 22 is also similarly connected to the relay 16 connecting the negative electrodes of the power supply 12 and the load 14, in Embodiment 1 of the present disclosure, the pre-charge circuit 22 connected to the relay 16 connecting the negative electrodes of the power supply 12 and the load 14 is not illustrated in the drawings in order to facilitate comprehension. Also, both the relay 16 and pre-charge relay 20 are relays that switch a contact portion on and off by moving the contact portion in a state where an excitation coil is energized, and on/off control is performed by a control circuit (not shown). As described above, the circuit structure 10a and the circuit structure 10b have substantially the same structure.

Circuit Structure 10

Figure 6:
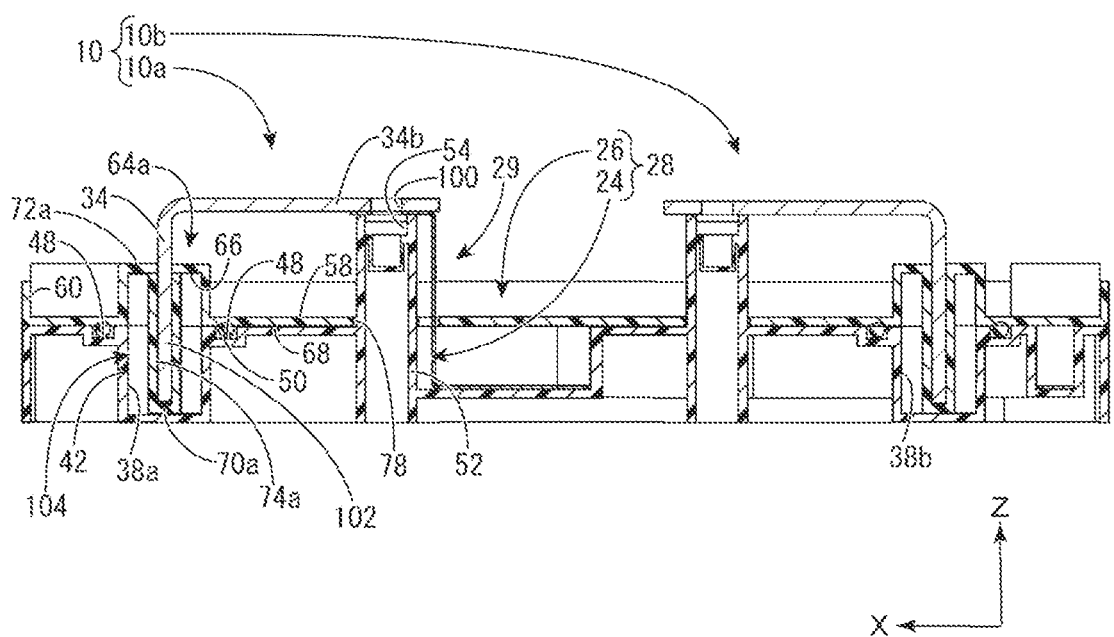
FIG. 6 is an enlarged cross-sectional view taken along line VI-VI in FIG. 5.

As shown in FIGS. 1 and 6, for example, the circuit structure 10 includes a lower case 24 that is located on the lower side and an upper case 26 that is located on the upper side when installed in a vehicle, and an insulating base member 28 is formed by the lower case 24 and the upper case 26. A bus bar 29 that connects the relay 16 and the pre-charge circuit 22 and a bus bar 30 that connects the interior of the pre-charge circuit 22 are housed between the lower case 24 and the upper case 26 when attached to each other. Also, two relays 16 and bus bars 34 and 36 respectively connected to connection portions 32a and 32b of the relays 16 are held by the base member 28 in which the lower case 24 and the upper case 26 are attached to each other.

Lower Case 24

The lower case 24 is formed by injection-molding an insulating synthetic resin into a predetermined shape. The synthetic resin forming the lower case 24 may include a filler such as glass fiber. As shown in FIG. 1, for example, the lower case 24 has an overall horizontally-elongated flat block shape. As shown in FIG. 1, screw holes 37 that have a rectangular cross-section and are open upward are provided in four corners of the lower case 24.

As shown in FIG. 1, for example, the lower case 24 is provided with grooves 38a and 38b that are open upward and extend along circumferential edge portions, in the vicinity of the two circumferential edge portions in the width direction of the lower case 24. The grooves 38a and 38b are linked by a linking groove 40 that extends in the width direction of the lower case 24 at the center portion in the length direction of the lower case 24 and is open upward. A lower passage wall portion 42 is formed by wall portions of the grooves 38a and 38b and the linking groove 40. Also, at an end portion on one side in the length direction of the groove 38a (the right side in FIG. 1), a dividing wall portion 44 is provided protruding at a height that is the same as the depth of the groove 38a at a central portion of the groove 38a, and the groove 38a is divided into two by the dividing wall portion 44. The dividing wall portion 44 has a rectangular flat plate shape, and the end portion thereof on the one side in the length direction is linked to the wall portion of the groove 38a, and a recessed portion 46 that spans the entire vertical length of the dividing wall portion 44 is formed in the end portion on the other side in the length direction (the left side in FIG. 1). As described below, in order to form two hose attachment coolant input/output portions 86 through which coolant is to flow, the end portions where the groove 38a divided into two are formed at different positions in the length direction. Furthermore, a groove-shaped sealing rubber housing recess 48 that extends along the circumferential edge portion of the grooves 38a and 38b and the linking groove 40 and is open upward is formed on the lower passage wall portion 42 in the vicinity of the circumferential edge portions of the grooves 38a and 38b and the linking groove 40. An annular piece of sealing rubber 50 that is made of rubber is housed in the sealing rubber housing recess 48.

Also, as shown in FIG. 1, for example, rectangular tube-shaped bus bar fixing portions 52 to which end portions of the bus bars 34 and 36 connected to the connection portions 32a and 32b of the relays 16 are to be bolted protrude upward at four positions of the central portion of the lower case 24. The central portion of the protruding end surface of each bus bar fixing portion 52 is provided with a bolt insertion hole 54 that has a rectangular cross-section and is open upward. Relay fixing portions 56 that have a rectangular cross-section and to which later-described leg portions 94 of the relays 16 are to be bolted are formed open upward at six positions toward the center relative to the bus bar fixing portions 52.

Upper Case 26

The upper case 26 is formed by injection-molding an insulating synthetic resin into a predetermined shape. The synthetic resin forming the upper case 26 may include a filler such as glass fiber. As shown in FIG. 1, for example, the upper case 26 has an overall box shape that is open upward in which a peripheral wall 60 that protrudes upward is formed on an outer circumferential edge portion of an upper wall 58 that has a substantially horizontally-elongated rectangular flat plate shape. Bolt insertion holes 62 that extend through the upper wall 58 in the plate thickness direction thereof are provided in four corners of the upper wall 58 of the upper case 26.

Figure 2:
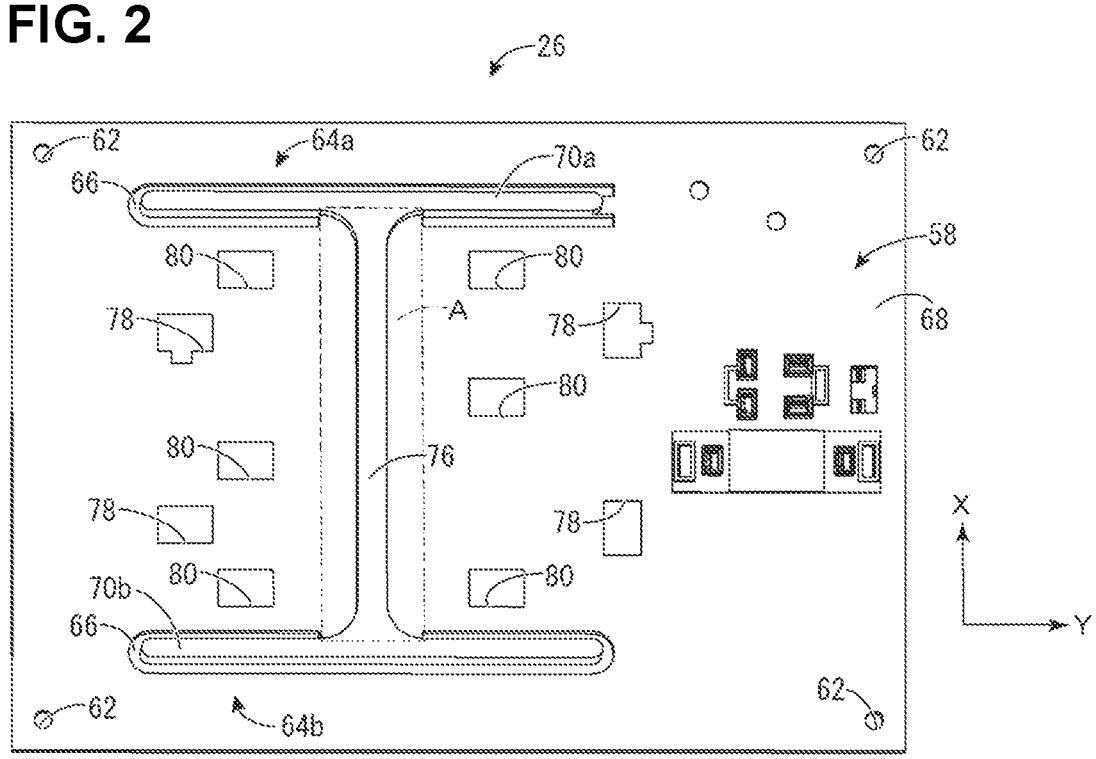
FIG. 2 is a bottom view of an upper case shown in FIG. 1.

As shown in FIG. 1, the upper wall 58 of the upper case 26 is provided with lid portions 64a and 64b that cover the corresponding grooves 38a and 38b of the lower case 24 and protrude in a recessed groove shape that is open downward. Furthermore, a lid portion that covers the linking groove 40 of the lower case 24 is constituted by a region A of the upper wall 58 that covers the linking groove 40 from above (the portion indicated with a broken line in FIGS. 1 and 2). In other words, the lid portions 64a and 64b and the region A of the upper wall 58 form an upper passage wall portion. Also, as shown in FIG. 2 showing a bottom surface 68 of the upper case 26, lower surfaces 66 of the lid portions 64a and 64b are respectively provided with protrusion portions 70a and 70b that protrude beyond the bottom surface 68 of the upper wall 58 of the upper case 26. A protrusion portion 76 is provided in the region A of the upper wall 58 of the upper case, protruding from the bottom surface 68. The protrusion portion 76 extends in the X direction shown in FIG. 2 and is linked as one piece with the protrusion portions 70a and 70b provided at two end portions thereof. As shown in FIG. 1, slit-shaped bus bar housing grooves 74a and 74b that are open in upper surfaces 72a and 72b of the lid portions 64a and 64b are respectively formed in the upper surfaces 72a and 72b. Also, the bus bar housing grooves 74a and 74b extend in the length direction of the lid portions 64a and 64b (left-right direction in FIG. 1). As described above, the upper passage wall portion is configured to include the lid portions 64a and 64b and the region A of the upper wall 58 that cover the lower passage wall portion 42, and the protrusion portions 70a, 70b, and the protrusion portion 76 respectively protruding from the lid portions 64a and 64b and the region A.

Also, as shown in FIG. 1, for example, bus bar fixing portion open windows 78 that expose the bus bar fixing portions 52 provided on the lower case 24 to the upper side of the upper case 26 are provided at four positions in the central portion of the upper case 26 extending through the upper case 26. Furthermore, six relay fixing portion open windows 80 for exposing the six relay fixing portions 56 provided on the lower case 24 to the upper side of the upper case 26 are provided extending through the upper case 26. Also, a pre-charge resistor installation portion 82 and a pre-charge relay installation portion 84 that respectively house the pre-charge resistor 18 and the pre-charge relay 20 are provided open upward on the one side in the length direction of the upper wall 58 of the upper case 26 (the right side in FIG. 1). Furthermore, a pair of coolant input/output portions 86 for supplying a coolant to later-described coolant flow paths 104 are formed on the front side of the pre-charge relay installation portion 84. The pair of coolant input/output portions 86 each have a cylindrical shape that is open in the vertical direction, and are configured such that coolant flows therethrough via hoses (not shown) that supply a coolant and are attached to the upper opening portions thereof via metal hose joints 88.

Relay 16

Figure 4:
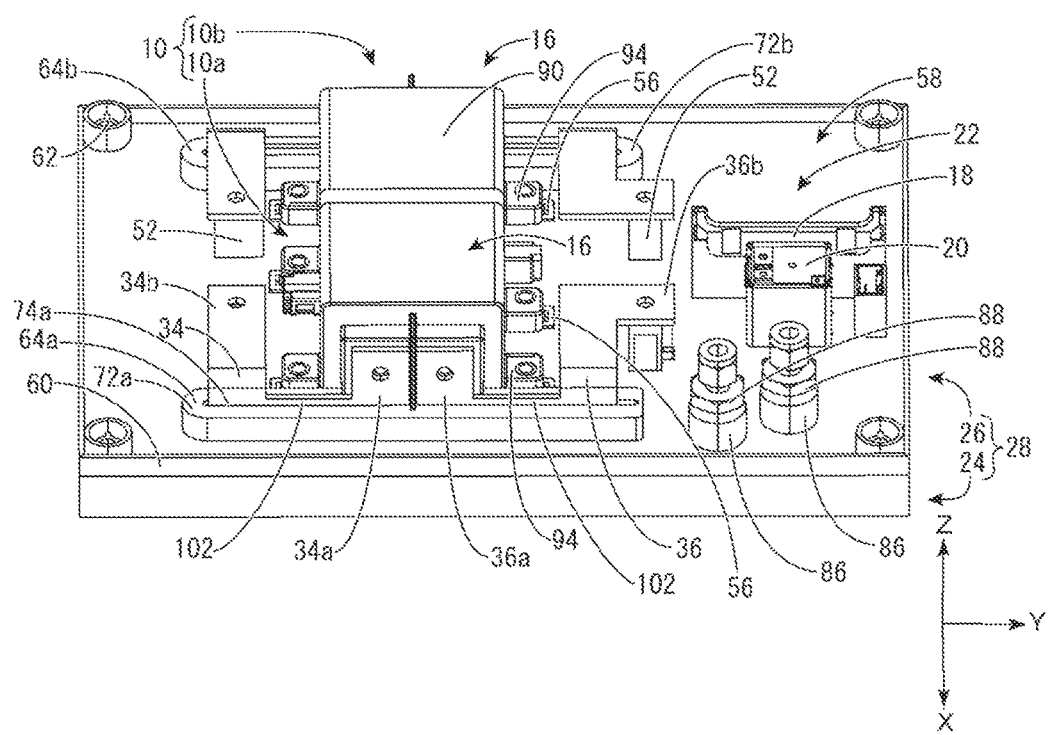
FIG. 4 is an overall perspective view of the circuit structure shown in FIG. 1.
Figure 5:
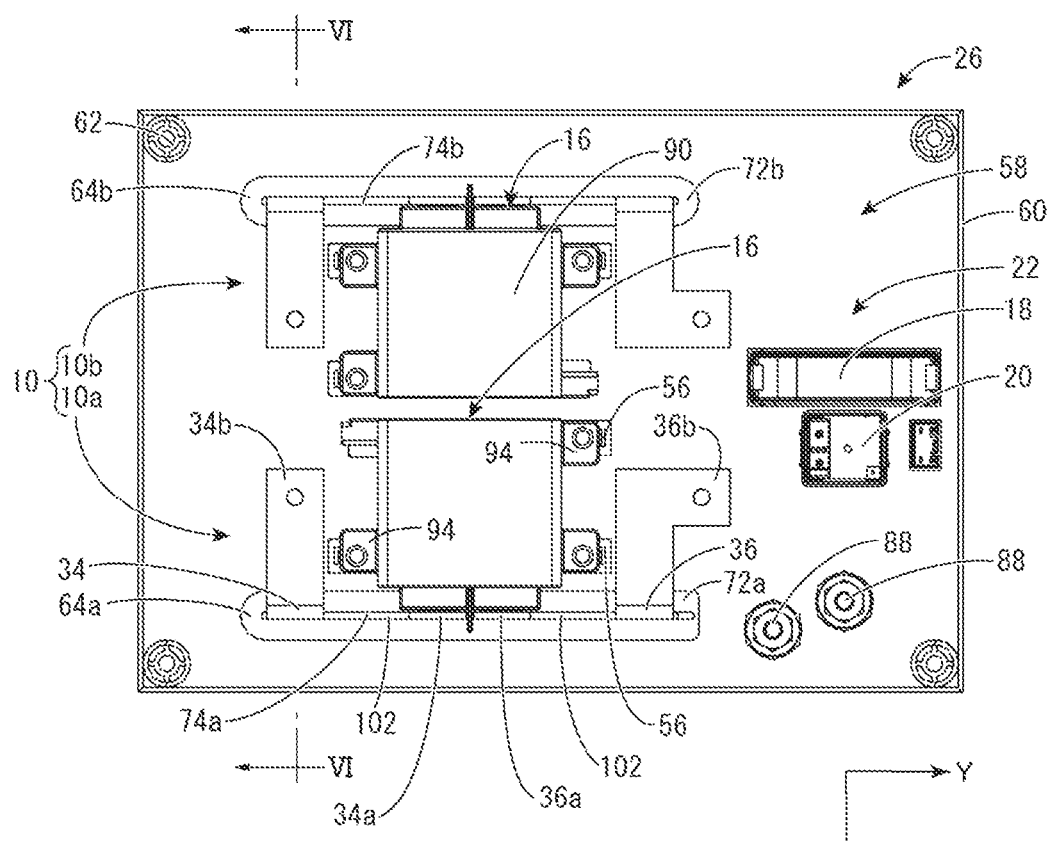
FIG. 5 is a plan view of the circuit structure shown in FIG. 4.

Each relay 16 is a mechanical relay, and is turned on and off by a control circuit (not shown). As shown in FIGS. 1, 4, and 5, the relay 16 includes a block-shaped relay body 90, a pair of annular connection portions 32a and 32b, and a plurality (three in the present embodiment) of leg portions 94. The relay body 90 includes a contact portion and a coil portion (not shown) therein. The pair of connection portions 32a and 32b are arranged lined up in the width direction (the left-right direction in FIGS. 1, 4, and 5) on the front surface of the relay body 90. Due to a current flowing across the pair of connection portions 32a and 32b via the contact portion of the relay body 90, heat generated by the contact portion is transferred to the pair of connection portions 32a and 32b that then generate heat. The connection portions 32a and 32b each include a bottomed cylindrical bolt insertion hole 92 that extends rearward. Two leg portions 94 are provided on a side surface on the one side in the width direction of the relay body 90 (right side in FIG. 1), and one leg portion 94 is provided on the side surface on the other side in the width direction of the relay body 90 (the left side in FIG. 1), the leg portions 94 being formed protruding outward in a flat plate shape. Each leg portion 94 has a bolt insertion hole 96 extending therethrough in the vertical direction.

Bus Bars 34 and 36

The pair of bus bars 34 and 36 are each formed by machining a metal plate member that has conductive properties. As shown in FIG. 1, for example, the bus bars 34 and 36 are U-shaped, and the corresponding end portions thereof on one side are first connection portions 34a and 36a that are to be connected to the connection portions 32a and 32b of the relay 16, and each include a bolt insertion hole 98 that extends therethrough in the front-rear direction, which is the plate thickness direction. By bolting the bus bars 34 and 36 to the connection portions 32a and 32b of the relay 16, the bus bars 34 and 36 are electrically and thermally connected to the connection portions 32a and 32b of the relay 16. The end portions on the other side of the bus bars 34 and 36 are respectively provided with second connection portions 34b and 36b in extension end portions thereof that extend rearward in a straight line or in an L shape. The second connection portions 34b and 36b each include a bolt insertion hole 100 extending therethrough in the vertical direction, which is the plate thickness direction. Also, the pair of bus bars 34 and 36 are respectively provided with extension portions 102 that extend away from each other from the bottom end portions of the first connection portions 34a and 36a. In Embodiment 1, of the pair of bus bars 34 and 36, the bus bar 34 is connected to the connection portion 32a on the positive side of the relay 16, and the bus bar 36 is connected to the connection portion 32b on the negative side of the relay 16.

Assembly Process of Circuit Structure 10

Next, an example of an assembly process of the circuit structure 10 will be described. The assembly process of the circuit structure 10 is not limited by the following description.

First, the lower case 24 and the upper case 26 constituting the base member 28 are prepared. Then, the bus bar 29 connecting the relays 16 and the pre-charge circuit 22 and the bus bar 30 that connects the interior of the pre-charge circuit 22 are disposed and housed in the lower case 24 from above. Further, the sealing rubber 50 is disposed and housed in the sealing rubber housing recess 48. Next, the upper case 26 is placed, from above, onto the lower case 24 configured as described above, and bolts (not shown) are passed through the bolt insertion holes 62 provided in four corners of the upper case 26 and fastened to the screw holes 37 of the lower case 24. Accordingly, the lower case 24 and the upper case 26 are attached to each other, thus ensuring insulation against other members external to the bus bars 29 and 30.

In a state where the lower case 24 and the upper case 26 are attached to each other, the leg portions 94 of the two relays 16 are placed on the corresponding relay fixing portions 56 exposed to the outside from the relay fixing portion open windows 80 in the upper case 26 and fixed thereto using bolts. Then, the bus bars 34 and 36 are respectively attached to the two relays 16. More specifically, the first connection portions 34a and 36a of the bus bars 34 and 36 are placed on the front side of the connection portions 32a and 32b of the relays 16, respectively. The second connection portions 34b and 36b of the bus bars 34 and 36 are respectively placed on the bus bar fixing portions 52 of the lower case 24 that are exposed to the outside from the bus bar fixing portion open windows 78. At the same time, the extension portions 102 of the bus bars 34 and 36 are respectively press-fitted into the bus bar housing grooves 74a and 74b provided in the lid portions 64a and 64b of the upper case 26. Lastly, the first connection portions 34a and 36a of the bus bars 34 and 36 are bolted and thus thermally and electrically connected to the connection portions 32a and 32b of the relays 16, respectively. Accordingly, the second connection portions 34b and 36b of the bus bars 34 and 36 are co-fastened with the bus bar 29, on each of the bus bar fixing portions 52 of the lower case 24, and the circuit structure 10 of the present embodiment is complete. The circuit structure 10 of the present embodiment configured in this manner is installed at a predetermined position of a vehicle and used with hoses for supplying a coolant attached to the pair of coolant input/output portions 86 of the upper case 26 via the hose joints 88. In other words, one end portion of each of the pair of coolant input/output portions 86 is connected to the later-described coolant flow paths 104, and the other end portions are connected to an external coolant supply path (not shown). In the present embodiment, by using a coolant that can be used in a vehicle such as radiator fluid, a coolant can be easily supplied to the coolant flow paths 104 via the pair of coolant input/output portions 86.

Figure 7:
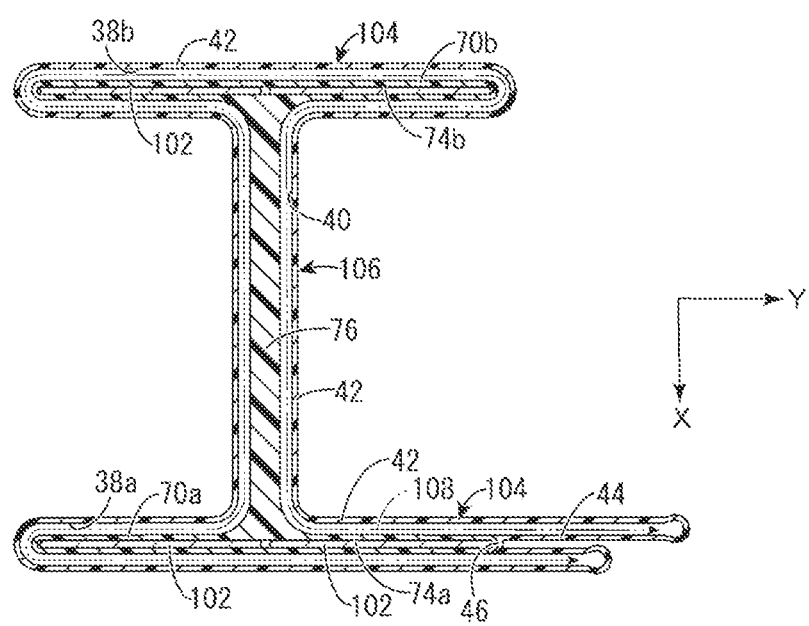
FIG. 7 is a lateral cross-sectional view outlining a coolant flow path in a state where a lower case is attached to the upper case in FIG. 1.

As shown in FIGS. 1, 5, and 6, for example, in the circuit structure 10 thus configured, the lid portions 64a and 64b and the region A of the upper wall 58 that form the upper passage wall portion are attached to and cover, from above, the lower passage wall portion 42 constituted by the wall portions of the grooves 38a and 38b and wall portion of the linking groove 40. At this time, as a result of the sealing rubber 50 housed in the sealing rubber housing recess 48 being compressed and brought into close contact with the sealing rubber housing recess 48 and the upper wall 58 of the upper case 26, the lower passage wall portion 42 and the lid portions 64a and 64b of the upper case 26 constituting the upper passage wall portion are linked in a liquid-tight manner. The coolant flow paths 104 are formed by including the lower passage wall portion 42 and the lid portions 64a and 64b constituting the upper passage wall portion that are linked in a liquid-tight manner. Also, the upper passage wall portion includes the protrusion portions 70a and 70b that protrude from the lid portions 64a and 64b of the upper case 26. The protrusion portions 70a and 70b protrude into the grooves 38a and 38b through which the coolant flows and that are demarcated by the lower passage wall portion 42, and divide the coolant flow paths 104 into two in the width direction as a result of the protruding end portions thereof coming into contact with the bottom surfaces of the grooves 38a and 38b. On the other hand, the region A of the upper wall 58 of the upper case 26 is attached to and covers, from above, the lower passage wall portion 42 that is constituted by the wall portion of the linking groove 40 that links the grooves 38a and 38b. In this case as well, as a result of the sealing rubber 50 housed in the sealing rubber housing recess 48 being compressed and brought into close contact with the sealing rubber housing recess 48 and the region A of the upper wall 58 of the upper case 26, the lower passage wall portion 42 and the region A of the upper wall 58 of the upper case 26 are linked in a liquid-tight manner. A coolant flow path linking portion 106 is formed by including the lower passage wall portion 42 and the region A of the upper wall 58 of the upper case 26 that are linked in a liquid-tight manner The protrusion portion 76 provided in the region A of the upper wall 58 of the upper case 26 protrudes into the linking groove 40 through which the coolant flows and that is demarcated by the lower passage wall portion 42, and divides the coolant flow path linking portion 106 into two in the left-right direction as a result of the protruding end portion thereof coming into contact with the bottom surface of the linking groove 40 (see FIG. 6). As a result of the above, as shown in FIG. 7, for example, a coolant flow path 108 from which coolant that has entered from one of the pair of coolant input/output portions 86 exits through the other of the pair of coolant input/output portions 86 is formed by the coolant flow paths 104 and the coolant flow path linking portion 106 that have been divided into two. Accordingly, the coolant can flow smoothly, and thus the base member 28 near the coolant flow paths 104 and the coolant flow path linking portion 106 can be efficiently cooled by the coolant. Thus, the circuit structure 10 includes the coolant flow paths 104 and the coolant flow path linking portion 106 that allow a coolant to flow inside the base member 28. As a result of the extension portions 102 of the bus bars 34 and 36 press-fitted into the bus bar housing grooves 74a and 74b of the protrusion portions 70a and 70b being in thermal contact with the coolant flow paths 104 via the protruding portions 70a and 70b, the bus bars 34 and 36 can also be efficiently cooled. Here, to facilitate comprehension, the coolant flow path 108 is shown with an imaginary line.

The circuit structure 10 of the present disclosure with the above-described structure includes the coolant flow paths 104 that allow a coolant to flow inside the base member 28. The extension portions 102 of the bus bars 34 and 36 are press-fitted into the bus bar housing grooves 74a and 74b of the protruding portions 70a and 70b protruding into the grooves 38a and 38b that constitute the coolant flow paths 104, and the bus bars 34 and 36 come into thermal contact with the coolant flow paths 104 via the protruding portions 70a and 70b. Accordingly, the extension portions 102 of the bus bars 34 and 36 to which heat from the relays 16, which are heat generating components, is transferred to via the pair of connection portions 32a and 32b can be brought into thermal contact with the coolant flow paths 104 via the protruding portions 70a and 70b and efficiently cooled. Thus, dissipation of heat from the relays 16, which are heat generating components, can be more reliably promoted with a shorter heat transfer path in comparison to a conventional structure, and thus the heat dissipating properties of the circuit structure 10 itself can be improved. Furthermore, the bus bars 34 and 36 are cooled by coolant that flows through the coolant flow paths 104, and thus a heat dissipation effect and a cooling effect can be improved in comparison with a conventional structure when the temperature of a chassis or a housing itself that is in thermal contact with the bus bars 34 and 36 reaches high temperatures exceeding 70° C.

Also, the extension portions 102 of the bus bars 34 and 36 are fixed by being press-fitted into the bus bar housing grooves 74a and 74b of the protrusion portions 70a and 70b, and thus the bus bars 34 and 36 can be more reliably and stably brought into thermal contact with the coolant flow paths 104. Therefore, the heat dissipating properties of the circuit structure 10 of the present disclosure can be advantageously improved. Furthermore, by using a simple structure in which the sealing rubber 50 is housed in the sealing rubber housing recess 48 provided in the lower passage wall portion 42, and compressing the sealing rubber 50 using the lid portions 64a and 64b and the region A constituting the upper passage wall portion, the lower passage wall portion 42 and the upper passage wall portion can be linked in a space-efficient and liquid-tight manner. Also, by housing the sealing rubber 50 in the sealing rubber housing recess 48, the holding properties and the positioning properties of the sealing rubber 50 are ensured, and the attachment operation is made easier.

OTHER EMBODIMENTS

The technique disclosed in the present description is not limited to the embodiment described based on the description above and the drawings, and embodiments such as those described below are also included in the technical scope of the technique disclosed in the present description.

(1) In the above embodiment, by press-fitting the extension portions 102 of the bus bars 34 and 36 into the bus bar housing groove portions 74a and 74b of the protrusion portions 70a and 70b that protrude into the grooves 38a and 38b constituting the coolant flow paths 104, the bus bars 34 and 36 are brought into thermal contact with the coolant flow paths 104 via the protrusion portions 70a and 70b, but the present invention is not limited to this. Thermal contact between the bus bars 34 and 36 and the coolant flow paths 104 can be realized with a suitable structure in which, for example, the bus bars 34 and 36 are arranged in the surrounding region of the coolant flow paths 104, and the bus bars 34 and 36 are brought into contact with the lower passage wall portion 42 and the lid portions 64a and 64b that constitute the coolant flow paths 104.

(2) In the above embodiment, the bus bars 34 and 36 are used as conductive members, for example, but the present invention is not limited to this, and the bus bars may simply be used for heat dissipation as long as they are connected to connection portions of heat generating components.

(3) In the above embodiment, the extension portions 102 of the bus bars 34 and 36 are press-fitted into the bus bar housing grooves 74*a* and 74*b* of the protrusion portions 70*a* and 70*b* that protrude into the grooves 38*a* and 38*b* constituting the coolant flow paths 104, but the present invention is not limited to this. Portions of the bus bars 34 and 36 may be embedded in the lower passage wall portion 42 or the lid portions 64*a* and 64*b* that constitute the upper passage wall portion through insert molding or the like.

(4) In the circuit structure 10 according to the present disclosure, the lower passage wall portion 42 and the lid portions 64*a* and 64*b* constituting the upper passage wall portion are all groove shaped, but there is no limitation to this. The upper passage wall portion may be formed by the region A of the flat plate-shaped upper wall 58 as is the case with the coolant flow path linking portion 106, and the shapes of the lower passage wall portion, the upper passage wall portion, and the coolant flow path can be set as appropriate.

(5) In the circuit structure 10 according to the present disclosure, the sealing rubber housing recess 48 is provided on the lower case 24 side, but the present invention is not limited to this, and the sealing rubber housing recess 48 may be provided on the upper case 26, or provided on both the lower case 24 and the upper case 26.

LIST OF REFERENCE NUMERALS

10 Circuit structure
10*a* Circuit structure
10*b* Circuit structure
12 Power supply
14 Load
16 Relay (heat generating component)
18 Pre-charge resistor
20 Pre-charge relay
22 Pre-charge circuit
24 Lower case
26 Upper case
28 Base member
29 Bus bar
30 Bus bar
32*a*, 32*b* Connection portion
34 Bus bar
34*a* First connection portion
34*b* Second connection portion
36 Bus bar
36*a* First connection portion
36*b* Second connection portion
37 Screw hole
38*a*, 38*b* Groove
40 Linking groove
42 Lower passage wall portion
44 Dividing wall portion
46 Recessed portion
48 Sealing rubber housing recess
50 Sealing rubber
52 Bus bar fixing portion
54 Bolt insertion hole
56 Relay fixing portion
58 Upper wall
60 Peripheral wall
62 Bolt insertion hole
64*a*, 64*b* Lid portion
66 Lower surface
68 Bottom surface
70*a*, 70*b* Protruding portion
72*a*, 72*b* Upper surface
74*a*, 74*b* Bus bar housing groove
76 Protruding portion
78 Bus bar fixing portion open window
80 Relay fixing portion open window
82 Pre-charge resistor installation portion
84 Pre-charge relay installation portion
86 Coolant input/output portion
88 Hose joint
90 Relay body
92 Bolt insertion hole
94 Leg portion
96 Bolt insertion hole
98 Bolt insertion hole
100 Bolt insertion hole
102 Extension portion
104 Coolant flow path
106 Coolant flow path linking portion
108 Coolant flow path

The invention claimed is:

1. A circuit structure comprising:
a heat generating component;
a bus bar connected to a connection portion of the heat generating component;
an insulating base member configured to hold the heat generating component and the bus bar; and
a coolant flow path provided inside the base member and through which a coolant flows,
wherein the bus bar is in thermal contact with the coolant flow path,
the base member includes a passage wall portion constituting the coolant flow path, and the bus bar is brought into thermal contact with the coolant flow path due to a portion of the bus bar being embedded or press-fitted into the passage wall portion, and
the passage wall portion includes a groove through which the coolant flows and a protruding portion that protrudes into the groove, the protruding portion includes a slit-shaped bus bar housing groove that is open in the upper surface thereof that does not face the groove, and the bus bar is press-fitted into the bus bar housing groove.

2. The circuit structure according to claim 1,
wherein the base member includes a lower case including a lower passage wall portion and an upper case including an upper passage wall portion that is linked in a liquid-tight manner to the lower passage wall portion, and the coolant flow path is formed by including the lower passage wall portion and the upper passage wall portion linked to each other in a liquid-tight manner.

3. The circuit structure according to claim 2,
wherein the upper passage wall portion includes a lid portion configured to cover the lower passage wall portion.

4. The circuit structure according to claim 2,
wherein at least one of the lower passage wall portion and the upper passage wall portion is configured to include a sealing rubber housing groove for housing a piece of sealing rubber, and due to the sealing rubber being compressed and brought into close contact with the sealing rubber housing groove, the lower passage wall portion and the upper passage wall portion are linked in a liquid-tight manner.

5. The circuit structure according to claim 1, wherein a coolant input/output portion is provided protruding from the base member, one end portion of the coolant input/output portion being connected to the coolant flow path, and the other end portion being connected to an external coolant supply path.

\* \* \* \* \*